(12) United States Patent
Rengachari et al.

(10) Patent No.: US 7,750,724 B2
(45) Date of Patent: Jul. 6, 2010

(54) TEMPERATURE AND PROCESS-STABLE MAGNETIC FIELD SENSOR BIAS CURRENT SOURCE

(75) Inventors: Thirumalai Rengachari, Austin, TX (US); Kartik Nanda, Dallas, TX (US); Larry L. Harris, Austin, TX (US); John Paulos, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/962,022

(22) Filed: Dec. 20, 2007

(65) Prior Publication Data

US 2009/0160535 A1 Jun. 25, 2009

(51) Int. Cl.
*G05F 1/10* (2006.01)
*G05F 3/02* (2006.01)

(52) U.S. Cl. .................. 327/538; 327/539; 323/313
(58) Field of Classification Search ............ 327/538, 327/539; 323/313
See application file for complete search history.

(56) References Cited

U.S. PATENT DOCUMENTS

| | | | | |
|---|---|---|---|---|
| 4,939,516 | A * | 7/1990 | Early | 341/143 |
| 5,621,319 | A * | 4/1997 | Bilotti et al. | 324/251 |
| 5,748,133 | A * | 5/1998 | Distinti | 341/161 |
| 6,362,618 | B1 | 3/2002 | Motz | |
| 6,380,874 | B1 * | 4/2002 | Knudsen | 341/118 |
| 6,437,718 | B1 * | 8/2002 | Oyama et al. | 341/143 |
| 6,583,741 | B1 * | 6/2003 | Knudsen | 341/143 |
| 6,621,334 | B2 * | 9/2003 | Ausserlechner et al. | 330/9 |
| 6,777,932 | B2 * | 8/2004 | Hara et al. | 324/251 |
| 6,861,839 | B2 * | 3/2005 | Hara et al. | 324/251 |
| 7,049,812 | B2 * | 5/2006 | Hara et al. | 324/251 |
| 7,161,520 | B2 * | 1/2007 | Liu et al. | 341/155 |
| 7,342,390 | B2 * | 3/2008 | Tachibana et al. | 323/316 |
| 7,425,821 | B2 * | 9/2008 | Monreal et al. | 324/117 H |
| 7,456,684 | B2 * | 11/2008 | Fang et al. | 330/9 |
| 7,471,134 | B2 * | 12/2008 | Dornbusch | 327/356 |
| 7,492,214 | B2 * | 2/2009 | Pan | 327/538 |

(Continued)

OTHER PUBLICATIONS

Kayal, et al., "Automatic Calibration of Hall Sensor Microsystems", Microelectronics Journal, 2006, pp. 1569-1575, vol. 3, Elsevier, Amsterdam, Netherlands.

(Continued)

*Primary Examiner*—Lincoln Donovan
*Assistant Examiner*—Adam D Houston
(74) *Attorney, Agent, or Firm*—Andrew M. Harris; Mitch Harris, Atty at Law, LLC

(57) ABSTRACT

A temperature and process-stable magnetic field sensor bias current source provides improved performance in Hall effect sensor circuits. A switched-capacitor sensing element is used to sense either a reference current or the bias current directly. A current mirror may be used to generate the bias current from the reference current, and may include multiple current source transistors coupled through corresponding control transistors that are switched using a barrel shifter to reduce variations in the bias current due to process variation. The current mirror control may be provided via a chopper amplifier to reduce flicker noise and the current mirror control voltage may be held using a track/hold circuit during transitions of the chopper amplifier to further reduce noise due to the chopping action.

22 Claims, 4 Drawing Sheets

U.S. PATENT DOCUMENTS

| | | | |
|---|---|---|---|
| 2002/0149506 A1* | 10/2002 | Altrichter et al. | 341/155 |
| 2005/0266821 A1* | 12/2005 | Dornbusch | 455/323 |
| 2006/0164073 A1 | 7/2006 | Bergsma | |
| 2007/0252573 A1* | 11/2007 | Tachibana et al. | 323/313 |
| 2008/0122457 A1* | 5/2008 | Taguchi | 324/679 |

OTHER PUBLICATIONS

U.S. Appl. No. 11/685,306, filed Mar. 13, 2007, Melanson.
U.S. Appl. No. 11/772,133, filed Jun. 30, 2007, Rengachari.
U.S. Appl. No. 11/685,324, filed Mar. 13, 2007, Melanson.
Pertjis, et al., "A CMOS Smart Temperature Sensor with a 3-sigma Inaccuracy of ±0.1C From −55C to 125C", IEEE JSSC vol. 40, No. 12, Dec. 2005, IEEE Press, pp. 2508-2518.
Demierre, et al., "Improvements of CMOS Hall Microsystems and Application for Absolute Angular Position Measurements", Ecole Polytechnique Federale de Lausanne, Sep. 2003, Switzerland.
Sentron AG, Datasheet for CSA-1V, Aug. 2004, Switzerland.
Pastre, et al., "A Hall Sensor Analog Front End for Current Measurement with Continuous Gain Calibration", IEEE International Solid-State Circuits Conference 2005 Digest of Papers, IEEE Press, pp. 242-243.
Travis, "Hall Effect Sensors Sport Magnetic Personalities", EDN, Apr. 1998.

* cited by examiner

TEMPERATURE AND PROCESS-STABLE MAGNETIC FIELD SENSOR BIAS CURRENT SOURCE

BACKGROUND OF THE INVENTION

1. Field of the Invention

The present invention relates generally to magnetic field sensors, and more specifically, to a bias current circuit that is stable across temperature and process variations.

2. Background of the Invention

Hall effect sensors and other semiconductor magnetic field sensors are widely used in applications in which it is desirable to provide a measurement of DC magnetic fields and relatively low frequency AC magnetic fields that are not otherwise easily sensed with coils or other antennas. Such applications include position and motion sensors for both linear and rotational motion, power supply and motor control applications in which the transformer or motor fields are detected, audio speaker applications in which the strength of the speaker's signal-induced field is detected, and lighting controllers for high-frequency energized lamps, such as sodium lamps.

Hall effect sensors operate by providing a layer of semiconductor material with a bias current applied across one axis and sensing a voltage across the other axis. When a magnetic field is present, the uniformity of the current in the layer of material is distorted, causing non-uniform voltage distribution along the material and a differential voltage to appear across a pair of sensing terminals.

Since any variation in the bias current, including noise, is reflected in the output of the Hall effect sensor, the bias current source must be low-noise and stable over environmental changes such as temperature. Further, since temperature changes that affect the bias current source produce corresponding changes in the Hall effect sensor output, a temperature stable bias current source must be provided. While circuits employing Hall effect sensors may be calibrated, for integrated circuit applications, it is desirable to produce a solution that has low complexity and requires few or no external components.

Therefore, it would be desirable to provide a low noise bias current source for a semiconductor magnetic field sensor circuit having reduced noise and little variation over process and temperature.

SUMMARY OF THE INVENTION

The above stated objective of providing a low noise and temperature and process-stable bias current source for a semiconductor magnetic field sensor is accomplished in a circuit and method. The method is a method of operation of the circuit.

The circuit is a constant current source that includes a switched capacitor circuit implementing a current sensing element. By using a switched-capacitor circuit instead of a resistor, the voltage produced by the current sensing element is dependent only on the switching clock frequency and the ratio of the capacitances in the switched capacitor circuit. The result is a temperature/process stable feedback sense voltage, as capacitance ratios are virtually temperature and process independent.

The switched-capacitor current sensing element may either directly sense the bias current, or may sense a reference current from which the bias current is derived using a current mirror. The bias current source may be provided by multiple current source transistors and corresponding control transistors that are selected in rotation using a barrel-shifter or otherwise exclusively selected to provide an average bias current that has less process variation than a single current source would produce. The amplifier providing the current source control may be chopped to reduce the impact of flicker noise, and the current mirror control voltage may be held using a track/hold circuit during the transitions of the chopper amplifier.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a semiconductor magnetic field sensor biasing circuit and method. The biasing circuit is a current source having a very stable temperature characteristic, so that once the current source is calibrated, drift in the current supplied to the magnetic field sensor is substantially constant over temperature.

Figure 1:
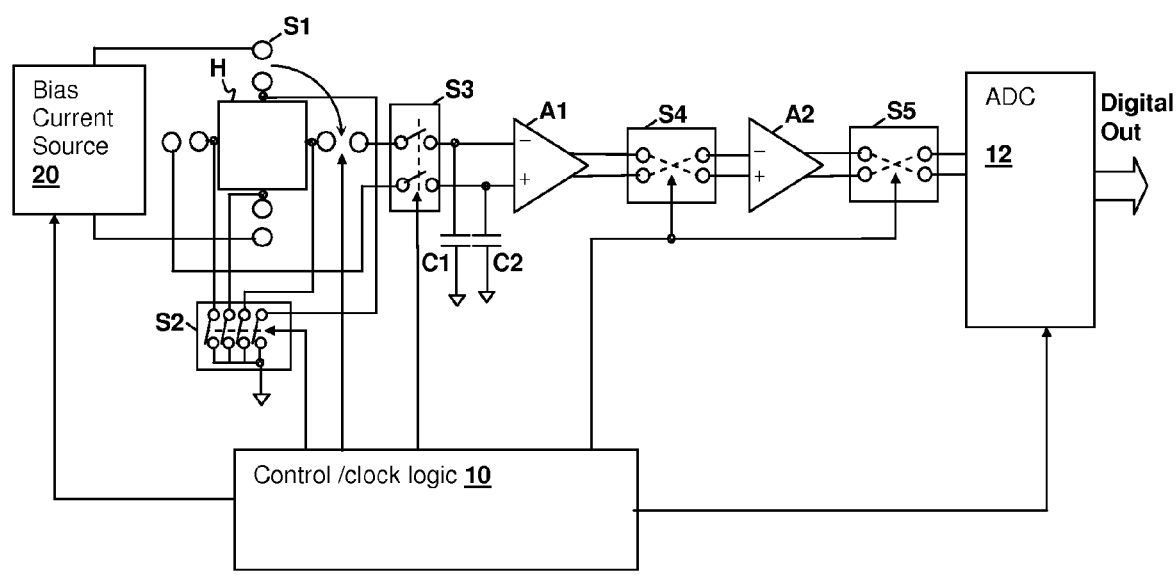
FIG. 1 is a block diagram depicting an exemplary magnetic field sensor circuit in accordance with an embodiment of the present invention.

Referring now to FIG. 1, an exemplary semiconductor magnetic field sensor circuit in accordance with an embodiment of the present invention is shown. A Hall effect sensor H, which may alternatively be another type of magnetic field sensor such as a magneto-resistive device, is provided a bias current from a bias current source 20 in accordance with an embodiment of the invention, and has output terminals connected to differential inputs of amplifier A1 via a sample/hold switch S3. A rotation switch S1 provides for rotation of each of the terminals of Hall effect sensor H, so that each terminal, in turn, serves as the positive and negative bias current and output voltage terminals, depending on a rotation phase controlled by control/clock logic 10.

A shorting switch S2 has a switching element for each of the terminals of Hall effect sensor H, and after each rotation, control/clock logic 10 activates all of the elements of switch S2 to short each of the terminals of Hall effect sensor H to ground, to coupled each of the terminals of Hall effect sensor H to another common-mode voltage reference such as voltage reference $V_{REF}$. Amplifier A1 has a differential pair of input terminals that are connected to a pair of hold capacitors C1 and C2. When switch S3 is open, amplifier A1 holds the voltage that was sampled when switch S3 was last closed. Control/clock logic 10 operates switch S3 such that switch S3 is opened prior to the rotation that occurs when rotation switch S1 is changed, is left open while shorting switch S2 momentarily shorts the terminals of Hall effect sensor H, and then returns amplifier A1 to the sample state a predetermined time after the shorting is complete and the new rotation is applied.

Switches S4, S5 and amplifier A2 provide a chopper amplifier that chops (modulates) the output of amplifier A1 to further reduce 1/f flicker noise and DC offset that might otherwise affect the measurement values provided to analog-to-digital converter (ADC) 12, which is generally a delta-sigma modulator ADC, but may be another type of ADC, to yield a digital output representation Digital Out of the magnetic field strength detected by Hall effect sensor H.

Figure 2:
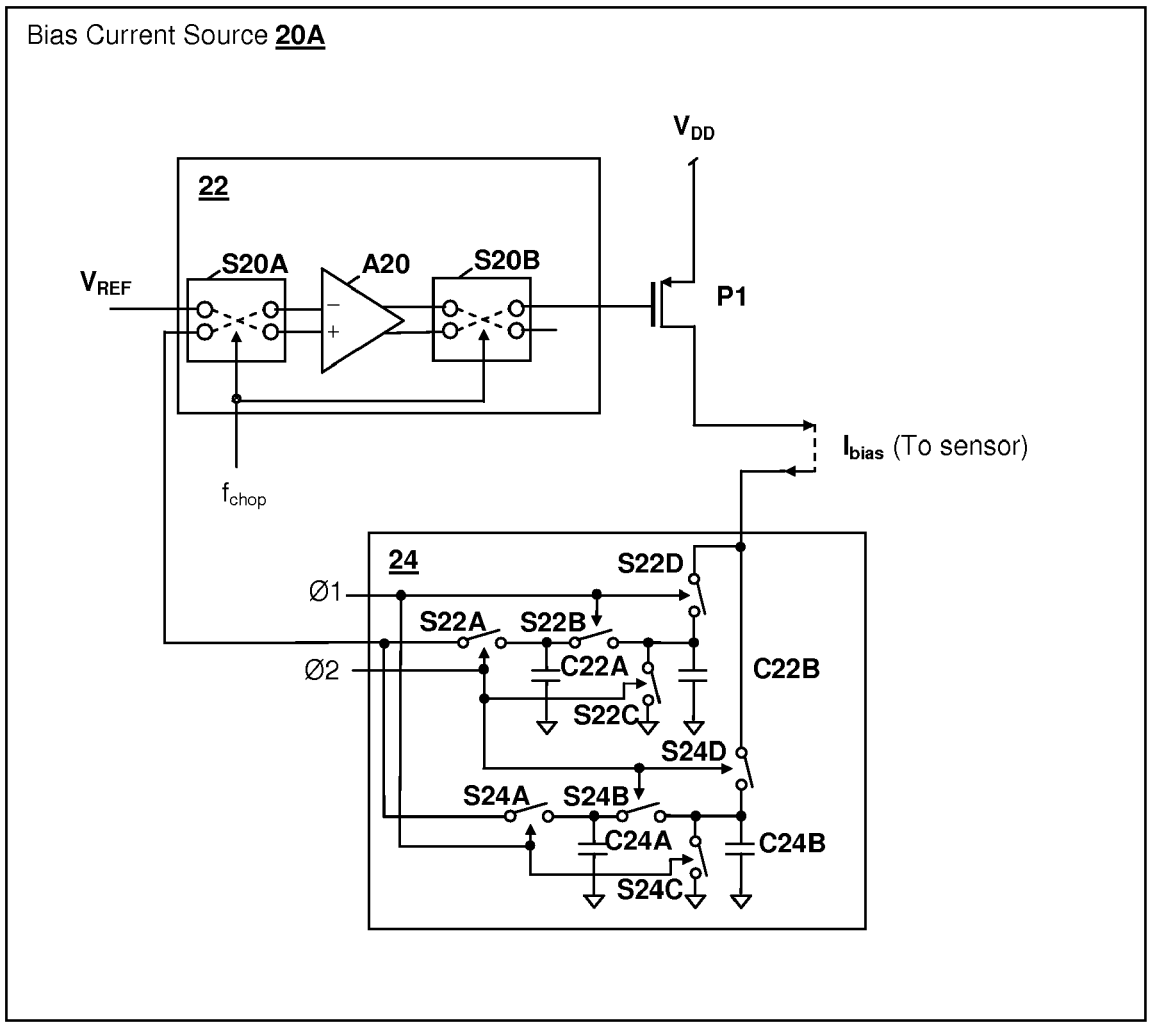
FIG. 2 is a circuit diagram depicting details of a magnetic field sensor bias circuit in accordance with an embodiment of the present invention.

Referring now to FIG. 2, details of a bias current source 20A are shown in accordance with an embodiment of the present invention that may be used to implement bias current source 20 of FIG. 1. A bias current $I_{bias}$ is supplied to Hall-effect sensor H by a current source transistor P1. A feedback loop senses bias current $I_{bias}$ and controls the gate of current source transistor P1 via chopper amplifier stage 22. Chopper amplifier stage 22 includes switch stages S20A and S20B, which exchange the inverting and non-inverting inputs and outputs of an amplifier A20, so that the effect of flicker (1/f) noise and amplifier offset are removed. Chopping is performed according to clock signal $f_{chop.}$, which may be provided externally or derived internally from a master clock signal. The feedback voltage is provided by a switched-capacitor sense element 24, rather than a conventional resistor. Switches S22A-S22D and capacitors C22A and C22B form a network that is clocked according to non-overlapping clock phases Ø1 and Ø2 to provide a voltage that is proportional to bias current $I_{bias}$ and otherwise dependent on only the frequency of clock phases Ø1 and Ø2 and the ratio of the capacitances of capacitors C22A and C22B. Since ratios of capacitance are very stable over process and temperature, the relationship between the sense voltage supplied to the input chopper amplifier stage 22 and bias current $I_{bias}$ does not vary significantly with temperature and process, providing a very stable reference source via which the remainder of the circuit can be calibrated and remain accurate.

A second switched-capacitor network is included, but is not required for operation. Including the second switched-capacitor network provides that the current is sampled during both of clock phases Ø1 and Ø2, as when capacitor C22B in the first network is disconnected by the opening of switch S22D at the end of clock phase Ø1, switch S24D is closed by the beginning of clock phase Ø2, reducing noise that would otherwise be generated in bias current $I_{bias}$ at the frequency of clock phases Ø1 and Ø2 and harmonics thereof.

Figure 3:
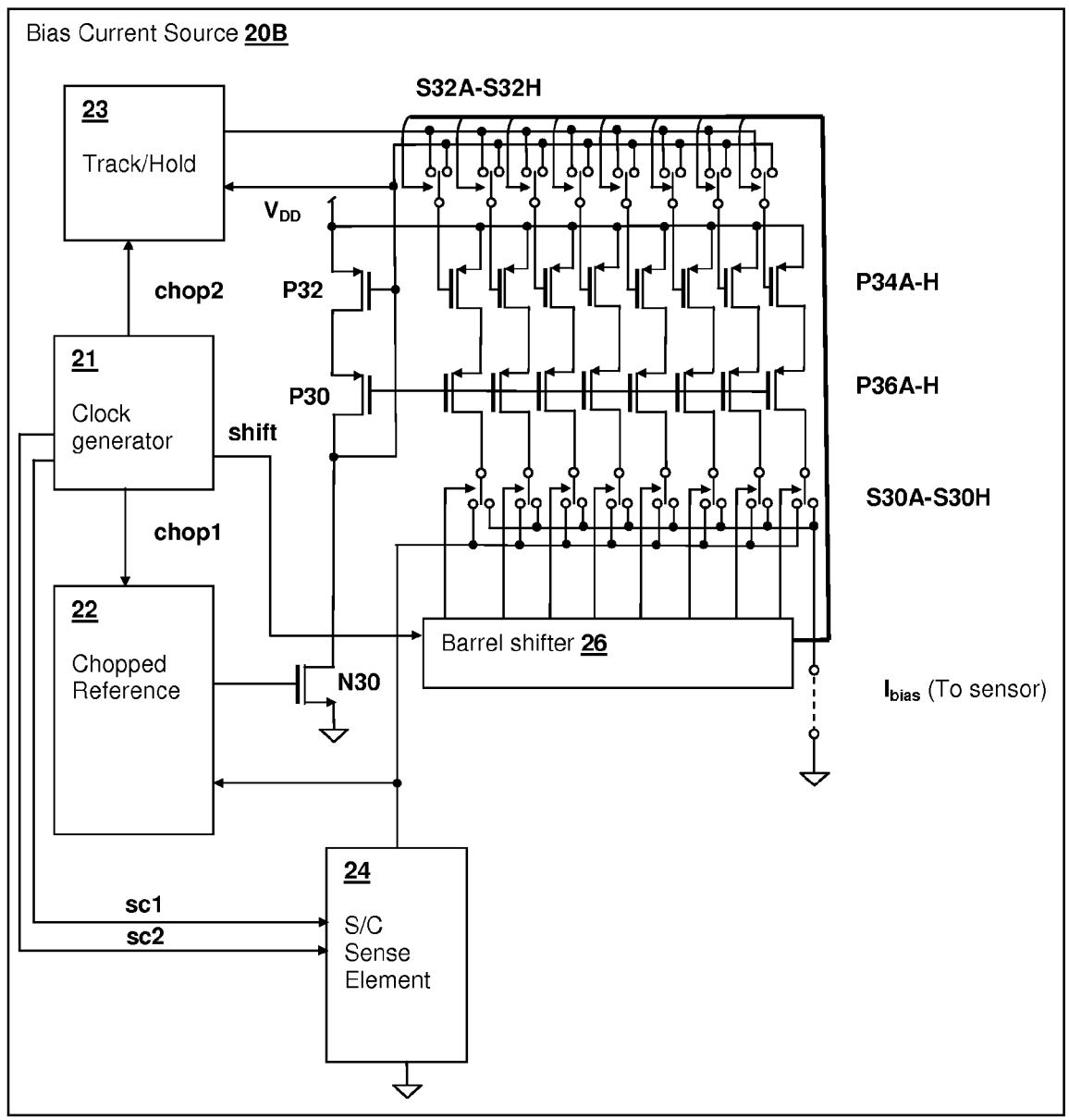
FIG. 3 is a circuit diagram depicting a magnetic field sensor bias circuit in accordance with another embodiment of the present invention.

Referring now to FIG. 3, details of another bias current source 20B are shown in accordance with another embodiment of the present invention that may be alternatively used to implement bias current source 20 of FIG. 1. The magnetic field sensor bias current source of FIG. 3 provides improved performance (more constant bias current) over temperature variation by using multiple current source transistors that are rotated (barrel-shifted) between serving as a feedback reference current source or the bias current source. Dynamic element matching (DEM) is provided by the rotation, so that variations between individual transistors produce less of an impact due to averaging across multiple devices. Transistor N30 serves as the primary reference current source that is controlled by chopped reference circuit 22 as described above with respect to FIG. 2. However, in the embodiment of FIG. 3, instead of controlling the bias current directly, a current mirror is implemented between transistor pair P30, P32 and a set of eight pairs of transistors P34A-P34H and P36A-P36H. Corresponding switches S30A-S30H control whether the drain terminals of transistors P34A-P34H are applied to switched-capacitor sense element 24 or supply bias current $I_{bias}$ to Hall-effect sensor H, according to control signals provided from barrel shifter 26. In the illustrated example, a different one of each of the eight transistors P36A-P36H is coupled to switched-capacitor sense element 24 by a corresponding one of switches S30A-S30H during each shift state of barrel shifter 26. Switched capacitor sense element 24 is operated by clock phase signals sc1 and sc2 provided from clock generator 21. The other seven transistors for each shift state are coupled together and to the bias current terminal to supply bias current $I_{bias}$ to Hall-effect sensor H. The rotation of the current sources averages the effect of any variation in transistors P34A-P34H and P36A-P36H.

Another feature of the present invention illustrated in the circuit of FIG. 3 is the inclusion of a track hold circuit 23 that is operated according to a phase chop2 of the chopping signal that operates chopped reference circuit 22 provided as chopping control signal chop1. In the illustrated example, signal chop2 is provided at twice the frequency of chopping control signal chop1, and is asserted for an interval surrounding the transitions of chopping control signal chop1. Signal chop2 acts as a blanking signal that activates a track hold circuit 23 to hold the voltage supplied to the gates of transistors P34A-P34H by a set of switches S32A-S32H according to the outputs of barrel shifter 26. Switches S32A-S32H are needed because the gate signal to the particular one of transistors P34A-P34H selected by barrel shifter 26 to supply current to switched-capacitor sense element 24 for each shift state cannot be placed in a "hold" state, or the feedback loop through chopped reference circuit 22 would be opened. Therefore, the control value provided to the gates of seven of transistors P34A-P34H that supply bias current $I_{bias}$ is held during the transitions of chopped reference 22. As long as the loop bandwidth of the feedback loop through chopped reference circuit 22 is sufficiently high to permit chopped reference and the current mirror reference arm provided by transistors N30, P30 and P32 to settle before track hold 23 is placed in the "track" state, distortion due to chopping in chopped reference 22 will not be reflected in bias current $I_{bias}$.

The use of transistor current source pairs, e.g., transistors P34A and P36A is dictated by maintaining the closed-loop reference operation when track hold circuit 23 is placed in the "hold" state. Since transistors P36A-P36H remain continuously connected to the gate of transistor P30, there is no disruption of the gate voltage on transistors P36A-P36H, when track/hold circuit 23 is placed in the "hold" state. While the illustrated embodiment of FIG. 3 provides constant current control from the positive power supply rail, it is understood that ground or negative power supplies are also suitable power supply rails for current providing a constant current source and that by changing the polarity type of the transistors in the depicted circuit, an equivalent mirror-image circuit can be constructed using ground or a negative power supply rail as the power supply rail from which the constant-current source of the present invention is provided.

Figure 4:
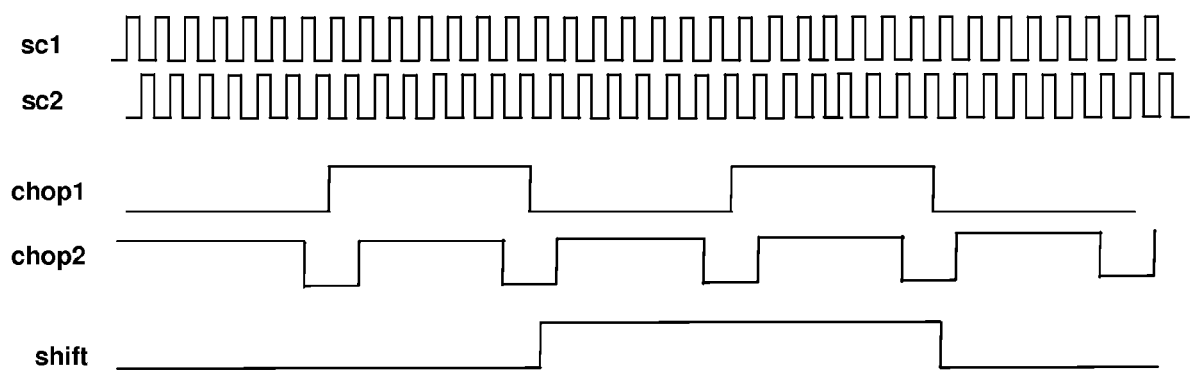
FIG. 4 is a timing diagram depicting switching signals and phases of operation of the magnetic field sensor circuits of FIGS. 1-3.

Referring now to FIG. 4, a signal timing diagram illustrates the relationship between signals of FIG. 3 and apply also to FIGS. 1 and 2 for those signals which are present. Switched capacitor clock phases sc1 and sc2 are operated at a high rate with respect to chopping clock signal chop1 and its corresponding "transition blanking" clock phase chop2, which surrounds the transitions of chopping clock signal chop1. The barrel shifter clock signal shift is operated in the example at half the rate of the chopping clock, and eight full cycles of signal shift are required to perform a full rotation of the transistors in the bias current source.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A temperature stable current source circuit, comprising:
at least one current source transistor having a drain providing at least one output of the current source circuit and a source coupled to a power supply voltage source;
a switched capacitor current sensing circuit coupled in series with the at least one output of the current source circuit and controlled by a clock signal, wherein a resistance of the switched capacitor current sensing circuit is dependent on a frequency of the clock signal; and
a feedback circuit having an input coupled to an output of the switched capacitor current sensing circuit and an output coupled to a gate of the at least one current source transistor.

2. The temperature stable current source circuit of claim 1, wherein the at least one current source transistor comprises first and second current mirror transistors connected as a current mirror, wherein the switched capacitor current sensing circuit is coupled in series with the first current mirror transistor for sensing a magnitude of a current output of a first one of the at least one output of the current source circuit, and wherein at least one other output of the current source circuit is provided from a drain of the second current mirror transistor.

3. The temperature stable current source circuit of claim 1, wherein the at least one current source transistor comprises a plurality of current source transistors, and wherein the temperature stable current source circuit further comprises:
a plurality of current source switches for enabling individual ones of the plurality of current source transistors in response to a plurality of switch control signal; and
a control circuit having outputs providing the plurality of switch control signals.

4. The temperature stable current source circuit of claim 3, wherein the control circuit is a barrel shifter.

5. The temperature stable current source circuit of claim 3, wherein the feedback circuit comprises:
a chopper amplifier having a clock input provided by a chopping clock signal; and
a track-hold circuit for holding a value of the output of the feedback circuit in response to a blanking signal, wherein the track-hold circuit is placed in a hold state during transitions of the chopping clock signal.

6. The temperature stable current source circuit of claim 5, wherein each of the plurality of current source transistors comprises a pair of current source transistors connected in series, wherein a first one of each pair of current source transistors has a gate connected to a common connection that is not interrupted by the track-hold circuit and wherein a second one of each pair of current source transistors has a gate selectively coupled to the output of the track-hold circuit or the output of the feedback circuit, according to a value of a corresponding one of the switch control signals.

7. The temperature stable current source circuit of claim 1, wherein the feedback circuit comprises:
a chopper amplifier having a clock input provided by a chopping clock signal; and
a track-hold circuit for holding a value of the output of the feedback circuit in response to a blanking signal, wherein the track-hold circuit is placed in a hold state during transitions of the chopping clock signal.

8. A method for providing a temperature-stable bias current, comprising:
sensing an indication of the magnitude of the bias current using a switched-capacitor sense element; and
controlling the magnitude of the bias current in conformity with a result of the sensing.

9. The method of claim 8, further comprising mirroring the bias current, and wherein the sensing senses a mirrored version of the bias current.

10. The method of claim 8, further comprising switching a source of the bias current from among a plurality of current source transistors, whereby averaging of the transistor characteristics reduces variation in the bias current with temperature.

11. The method of claim 10, wherein the switching is performed by a barrel shifter.

12. The method of claim 10, further comprising chopping a result of the sensing, wherein the controlling is performed in conformity with a result of the chopping.

13. The method of claim 12, further comprising holding a state of the controlling during transitions of the chopping.

14. The method of claim 8, further comprising chopping a result of the sensing, wherein the controlling is performed in conformity with a result of the chopping.

15. A current source circuit, comprising:
at least one current source transistor having a drain providing an output of the current source circuit and a source coupled to a power supply;
a current sensing circuit coupled in series with the output of the current source circuit;
a feedback circuit having an input coupled to an output of the current sensing circuit and an output coupled to a gate of the at least one current source transistor, wherein the feedback circuit includes a chopper amplifier having a clock input provided by a chopping clock signal; and
a track-hold circuit for holding a value of the output of the feedback circuit in response to a blanking signal, wherein the track-hold circuit is placed in a hold state during transitions of the chopping clock signal.

16. The current source circuit of claim 15, wherein the at least one current source transistor comprises at least one pair of current source transistors connected in series, wherein a first one of the at least one current source transistor has a gate connected to a common connection that is not interrupted by the track-hold circuit.

17. A method of supplying a bias current, comprising:
sensing an indication of the magnitude of the bias current;
chopping a result of the sensing;
controlling the magnitude of the bias current in conformity with a value determined from result of the chopping; and
holding a state of the value during transitions of the chopping.

18. The method of claim 17, wherein the controlling is performed by a pair of series-connected transistors, and wherein the holding holds the gate voltage of only one of each pair of series-connected transistors.

19. A current source for providing a bias current to a Hall effect sensor, comprising:
a plurality of current source transistors having drain terminals providing the bias current to the Hall effect sensor and having source terminals coupled to a common power supply;
a plurality of current source switches for enabling individual ones of the plurality of current source transistors in response to a plurality of switch control signals;

a control circuit having outputs providing the plurality of switch control signals;

a current sensing circuit for providing an output indicating a magnitude of a current provided from the sources of the plurality of current source transistors to the Hall effect sensor; and a feedback circuit having an input coupled to an output of the current sensing circuit and an output coupled to gates of the plurality of current source transistors.

20. The current source of claim 19, wherein the control circuit is a barrel shifter circuit.

21. A method for supplying a bias current to a Hall-effect sensor, comprising:

sensing an indication of the magnitude of the bias current;

controlling the magnitude of the bias current in conformity with a result of the sensing; and periodically reassigning a plurality of transistors between a first set of transistors providing the bias current and a second set of transistors performing the sensing.

22. The method of claim 21, wherein the second set of transistors is a single transistor.

* * * * *